United States Patent
Shimizu et al.

(10) Patent No.: US 9,373,724 B2
(45) Date of Patent: Jun. 21, 2016

(54) METHOD OF DRIVING TRANSISTOR AND DEVICE INCLUDING TRANSISTOR DRIVEN BY THE METHOD

(75) Inventors: Hisae Shimizu, Tokyo (JP); Katsumi Abe, Kawasaki (JP); Ryo Hayashi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 467 days.

(21) Appl. No.: 13/005,890

(22) Filed: Jan. 13, 2011

(65) Prior Publication Data

US 2011/0175674 A1 Jul. 21, 2011

(30) Foreign Application Priority Data

Jan. 15, 2010 (JP) ................................. 2010-006862

(51) Int. Cl.
*H01L 29/04* (2006.01)
*H01L 29/786* (2006.01)
*H01L 29/66* (2006.01)

(52) U.S. Cl.
CPC ...... *H01L 29/7869* (2013.01); *H01L 29/66969* (2013.01); *H01L 29/78606* (2013.01); *H01L 29/78633* (2013.01)

(58) Field of Classification Search
CPC ............... H01L 29/78606; H01L 29/66969; H01L 29/7869; H01L 29/78633
USPC .............................................. 257/57, E29.296
See application file for complete search history.

(56) References Cited

U.S. PATENT DOCUMENTS

| | | | |
|---|---|---|---|
| 6,043,536 A | 3/2000 | Numata et al. | |
| 2001/0030323 A1* | 10/2001 | Ikeda | H01L 29/78645 257/59 |
| 2005/0282317 A1* | 12/2005 | Ikeda | H01L 29/78648 438/149 |
| 2009/0021536 A1* | 1/2009 | Abe | G09G 3/2014 345/690 |
| 2009/0072232 A1* | 3/2009 | Hayashi | H01L 21/28202 257/43 |
| 2009/0206332 A1* | 8/2009 | Son | H01L 29/42384 257/43 |

FOREIGN PATENT DOCUMENTS

| | | |
|---|---|---|
| CN | 1941399 A | 4/2007 |
| JP | 8-8433 A | 1/1996 |

(Continued)

OTHER PUBLICATIONS

Nomura et. al.,"Room-temperature fabrication of transparent flexible thin-film transistors using amorphous oxide semiconductors", Nature, Nov. 2004, pp. 488-492, vol. 432.

(Continued)

*Primary Examiner* — Vongsavanh Sengdara
(74) *Attorney, Agent, or Firm* — Canon USA, Inc. I.P. Division

(57) ABSTRACT

Disclosed is a method of driving a transistor including a semiconductor layer, a first insulating layer, a second insulating layer, a first conductive layer, and a second conductive layer such that the semiconductor layer is disposed between the first and second insulating layers, one surface of the first insulating layer opposite the other surface in contact with the semiconductor layer is in contact with the first conductive layer, one surface of the second insulating layer opposite the other surface in contact with the semiconductor layer is in contact with the second conductive layer. The method includes applying a voltage VBG that satisfies the relation of $V_{BG} \leq V_{ON1} \times C_1/(C_1+C_2)$ to the second conductive layer.

7 Claims, 9 Drawing Sheets

(56) References Cited

FOREIGN PATENT DOCUMENTS

| | | |
|---|---|---|
| JP | 9-090405 A | 4/1997 |
| JP | 11-330482 A | 11/1999 |
| JP | 2001-284592 A | 10/2001 |
| JP | 2002-83969 A | 3/2002 |
| JP | 2007-157986 A | 6/2007 |
| JP | 2008-124215 A | 5/2008 |
| JP | 2009-176865 A | 8/2009 |
| JP | 2010-123938 A | 6/2010 |
| WO | 9927585 A1 | 6/1999 |

OTHER PUBLICATIONS

Yabuta et. al., "High-mobility thin-film transistor with amorphous InGaZnO4 channel fabricated by room temperature rf-magnetron sputtering" Applied Physics Letters 89, 112123, 2006.

* cited by examiner

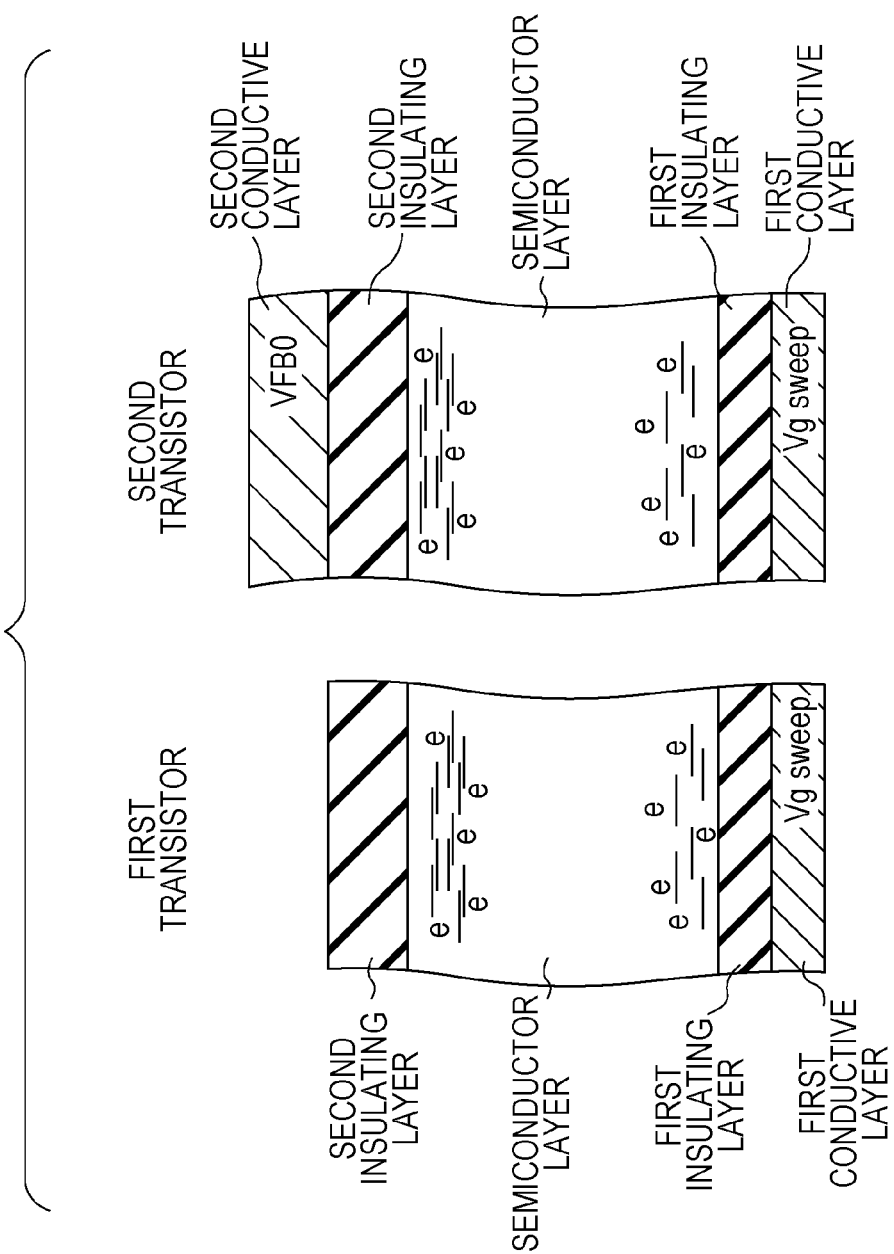

METHOD OF DRIVING TRANSISTOR AND DEVICE INCLUDING TRANSISTOR DRIVEN BY THE METHOD

BACKGROUND OF THE INVENTION

1. Field of the Invention

The present invention relates to a method of driving a transistor and a device including a transistor driven by the method. The driving method and the device including a transistor driven by the method according to the present invention are particularly suitable for a light-emitting display including pixels arranged in a matrix, each pixel including a light-emitting element and a driving circuit for supplying current to the light-emitting element, and a method of driving the display. For example, an organic electroluminescent (hereinafter, abbreviated to "EL") element is suitably used as a light-emitting element.

2. Description of the Related Art

The research and development of organic EL displays including organic EL elements as light-emitting elements have progressed in recent years. A typical organic EL display is of the active matrix (hereinafter, referred to as "AM") type in which each pixel includes a driving circuit in order to extend the life of the organic EL element and achieve high image quality. The driving circuit includes a thin film transistor (hereinafter, also abbreviated to "TFT") formed on, for example, a glass or plastic substrate.

In the organic EL display, a portion including the substrate and the driving circuit is called a "backplane". As for a channel material of the TFT for the organic EL display backplane, for example, amorphous silicon (hereinafter, abbreviated to "a-Si") and polycrystalline silicon (hereinafter, abbreviated to "p-Si") have been studied. In addition, amorphous oxide semiconductor (hereinafter, abbreviated to "AOS") has been newly proposed. AOS materials include, for example, indium (In) gallium (Ga) zinc (Zn) oxide (amorphous In—Ga—Zn—O; hereinafter, abbreviated to "a-IGZO") and zinc (Zn) indium (In) oxide (amorphous Zn—In—O; hereinafter, abbreviated to "a-ZIO"). An AOS TFT has great potential as a TFT for a display backplane because the AOS TFT has a mobility more than ten times as high as that of an a-Si TFT and exhibits high uniformity due to its amorphous nature. A TFT including a channel layer of AOS is disclosed in, for example, Nomura et al., "Nature", Vol. 432, pp. 488-492, 2004 and Yabuta et al., APL, 89, 112123, 2006.

Challenges to the achievement of high quality display in an AM organic EL display include, for example, (1) a change over time in the voltage-brightness characteristic of an organic EL element, (2) variations in the characteristics of TFTs, each serving as a component of a driving circuit, and (3) changes in characteristics of a TFT caused by electrical stress.

When an AOS TFT is included in each driving circuit, the above-described challenges (1) and (2) can be solved because the uniformity of the AOS TFT is high and a driving circuit for controlling current supplied from the AOS TFT to the organic EL element is used.

However, the above-described challenge (3) is left because there are changes in characteristics of the AOS TFT caused by electrical stress, mainly, the change of threshold voltage.

SUMMARY OF THE INVENTION

The present invention provides a method of driving a thin film transistor while reducing the change of threshold voltage caused by electrical stress, and a device including a transistor driven by the method.

The present invention provides a method of driving a transistor including a semiconductor layer connected to the source and drain electrodes of the transistor, a first insulating layer, a second insulating layer, a first conductive layer, and a second conductive layer such that the semiconductor layer is disposed between the first and second insulating layers, one surface of the first insulating layer opposite the other surface in contact with the semiconductor layer is in contact with the first conductive layer, one surface of the second insulating layer opposite the other surface in contact with the semiconductor layer is in contact with the second conductive layer, and the first conductive layer 1 serves as the gate electrode of the transistor, the method including applying a voltage VBG to the second conductive layer, the voltage VBG satisfying the relation of VBG≤VON1×C1/(C1+C2) where C1 denotes a capacitance per unit area of the first insulating layer, C2 denotes a capacitance per unit area of the second insulating layer, and VON1 denotes a turn-on voltage at which the drain current rises in the transfer characteristic of the transistor when the source voltage is set to a reference voltage and a voltage applied to the second conductive layer is set to 0 V.

The present invention further provides a method of driving a transistor including a semiconductor layer connected to the source and drain electrodes of the transistor, a first insulating layer, a second insulating layer, a first conductive layer, and a second conductive layer such that the semiconductor layer is disposed between the first and second insulating layers, one surface of the first insulating layer opposite the other surface in contact with the semiconductor layer is in contact with the first conductive layer, one surface of the second insulating layer opposite the other surface in contact with the semiconductor layer is in contact with the second conductive layer, and the first conductive layer 1 serves as the gate electrode of the transistor, the method including applying a voltage VBG to the second conductive layer, the voltage VBG satisfying the relation of VBG≤VT1×C1/(C1+C2) where C1 denotes a capacitance per unit area of the first insulating layer, C2 denotes a capacitance per unit area of the second insulating layer, and VT1 denotes a flat band voltage of the transistor.

According to the present invention, the change of threshold voltage of a TFT caused by electrical stress can be reduced. Reducing the change of threshold voltage of the TFT caused by electrical stress can allow a device including the TFT to maintain its performance for long time. In addition, an additional means for compensating for the change of threshold voltage of the TFT can be omitted. Thus, the device can be provided at lower cost.

Further features of the present invention will become apparent from the following description of exemplary embodiments with reference to the attached drawings.

BRIEF DESCRIPTION OF THE DRAWINGS

FIG. 4 illustrates the cross section of a related-art TFT and that of the TFT according to the embodiment.

DESCRIPTION OF THE EMBODIMENTS

Figure 1:
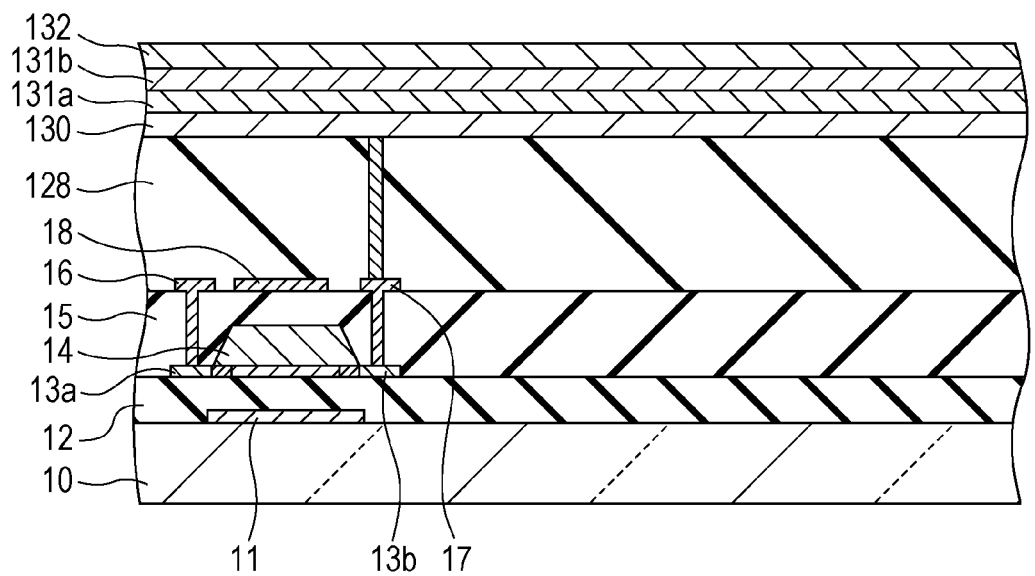
FIG. 1 is a cross-sectional view of a display device including a thin film transistor according to the present invention.

The inventors have obtained the following findings by evaluating the characteristics of AOS TFTs in detail.

The electrical characteristics of a typical AOS TFT change over time during operation. Specifically, the AOS TFT has the property of changing a threshold voltage due to electrical stress applied during operation. This is one of significant challenges to be solved for practical application of the AOS TFT.

Regarding this challenge, the inventors have found that the change of threshold voltage caused by electrical stress can be reduced in an AOS TFT, which includes three terminals, i.e., source, drain, and gate electrodes and further includes a back gate electrode as a fourth terminal, while a voltage within a certain range is applied to the back gate electrode. According to the present invention, an AOS TFT includes a semiconductor layer connected to its source electrode and its drain electrode, a first insulating layer, a second insulating layer, a first conductive layer, and a second conductive layer. The semiconductor layer is disposed between the first and second insulating layers. One surface of the first insulating layer opposite the other surface in contact with the semiconductor layer is in contact with the first conductive layer. One surface of the second insulating layer opposite the other surface in contact with the semiconductor layer is in contact with the second conductive layer. The first conductive layer serves as the gate electrode. In addition, the second conductive layer serves as the back gate electrode. A voltage within a range which will be described later is applied to the second conductive layer, thus reducing the change of threshold voltage caused by electrical stress. The back gate electrode is configured to control a back channel. As described above, the back gate electrode is disposed on the opposite side of the semiconductor layer from the gate electrode. The back channel is a region in the semiconductor layer on a side opposite to the gate electrode.

Factors of Change of Threshold Voltage

The following factors of the change of threshold voltage of a TFT caused by electrical stress are considered.

The change of threshold voltage of a TFT whose semiconductor layer (channel layer) comprises an amorphous material, such as a-Si or AOS, can be generally attributed to trapping of carriers at trap levels. Among the trap levels, particularly, deep levels from which trapped carries are difficult to be released can cause the change of threshold voltage of the TFT.

In order to trap carriers into trap levels, the trap levels have to be present and the carriers have to be present near the trap levels. Accordingly, the amount of carriers trapped at a trap level correlates with the product of a trap level density and a carrier density. Consequently, the amount of trapped carriers can be reduced by reducing the trap level density or the carrier density.

The inventors have paid attention to the fact that the trap level density on the back gate electrode side of the semiconductor layer is higher than that on the gate electrode side thereof and have proposed that a variation in threshold voltage of a TFT should be reduced by reducing the carrier density on the back gate electrode side of the semiconductor layer.

Reduction of Carrier Density Causing Change of Threshold Voltage

The above-described trap levels can be caused during manufacture of a TFT and be present at the completion of the manufacture. Alternatively, the trap levels can be caused by heat, electric field, or current during driving of the TFT. Accordingly, the trap level density also depends on the configuration of a semiconductor layer, the configuration of a device, or a manufacturing process. For example, when the semiconductor layer contains many impurities, the trap level density may be high at the completion of manufacture of the TFT, alternatively, new traps can be formed during driving of the TFT. If the semiconductor layer is damaged upon formation of another layer on the semiconductor layer or upon etching, the trap level density may be high at the completion of manufacture of the TFT or new traps can be formed during driving of the TFT.

Figure 3:
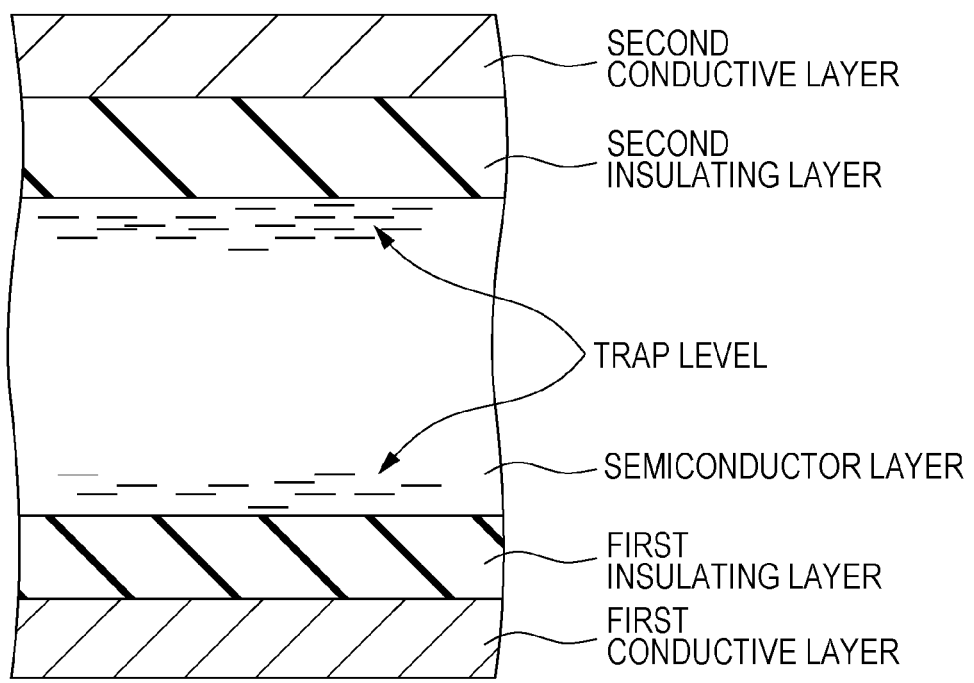
FIG. 3 is a cross-sectional view of a TFT according to an embodiment of the present invention.

When the first conductive layer, the first insulating layer, the semiconductor layer, the second insulating layer, and the second conductive layer are stacked on the substrate in that order from the bottom, as illustrated in FIG. 3, the trap level density of a region adjacent to the second conductive layer in the semiconductor layer can be higher than that of a region adjacent to the first conductive layer because the semiconductor layer has been damaged upon formation of the second insulating layer. In this case, reducing the carrier density of the region having the high trap level density, i.e., the region on the back gate electrode side of the semiconductor layer (adjacent to the second conductive layer, serving as the back gate electrode, when the first conductive layer serves as the gate electrode) is effective in reducing the change of threshold voltage of the TFT.

Flat Band Voltage

One of ways effective in reducing the carrier density of the region on the back gate electrode side of the semiconductor layer is to control the carrier density using a voltage (back gate voltage) applied to the back gate electrode. To discuss an effective back gate voltage, the concept of a flat band voltage of a TFT is introduced.

FIG. 4 illustrates the configuration of a first transistor and that of a second transistor. The first transistor is a related-art three-terminal TFT which does not include the second conductive layer and includes the first conductive layer, serving as the gate electrode. The second transistor is a four-terminal TFT which includes the first conductive layer, serving as the gate electrode, and the second conductive layer, serving as the back gate electrode. The source and drain electrodes of each transistor are not illustrated in FIG. 4.

In the first transistor, when $\sigma$ denotes electrical conductivity peculiar to the semiconductor layer, W denotes the channel width of the TFT, L denotes the channel length thereof, ts denotes the thickness of the semiconductor layer, and VD denotes a drain voltage, a current expressed as the following equation is defined as a flat band current.

$$IFB = ts \times W \times \sigma \times VD/L \quad (1)$$

In this case, a flat band voltage VFB0 can be defined as follows.

$$VFB0 = \text{(gate voltage necessary to supply the flat band current } IFB) \quad (2)$$

In the first transistor, the density of carriers induced in the semiconductor layer by the difference between a voltage applied to the first conductive layer and a voltage in the semiconductor layer determines a drain current flowing between the drain and the source in the semiconductor layer. When the flat band voltage VFB0 is applied to the first conductive layer, serving as the gate electrode of the first transistor, any new carrier is not induced, except for intrinsic carriers of the semiconductor layer, and a drain current identical to the flat band current IFB flows.

In the second transistor, the density of carriers induced in the semiconductor layer by the difference between a voltage applied to each of the first and second conductive layers and a voltage in the semiconductor layer determines a drain current flowing between the drain and the source in the semiconductor layer. When the flat band voltage VFB0 is applied to the second conductive layer, serving as the back gate electrode of the second transistor, carriers are not induced into the semiconductor layer by the back gate electrode and the carrier density is the intrinsic one of the semiconductor layer. At this time, a drain current is determined by the number of carriers induced by the difference between a voltage applied to the first conductive layer and a voltage in the semiconductor layer. Accordingly, the transfer characteristic (IDS-VGS characteristic) of the second transistor upon application of the flat band voltage VFB0 to the back gate electrode is the same as that of the first transistor. The symbol "IDS" denotes the drain-source current and the symbol "VGS" denotes the gate-source voltage. In addition, since the carrier density of the semiconductor layer in the first transistor is identical to that in the second transistor, a variation in threshold voltage caused by electrical stress in the first transistor can also be identical to that in the second transistor.

Electrical Stress

Regarding application of electrical stress, continuously allowing a constant current to flow between the drain and the source of a TFT (constant current stress) and continuously applying a constant voltage to each electrode terminal of the TFT (constant voltage stress) will be described below separately.

Application of Constant Current Stress

Figure 5A:
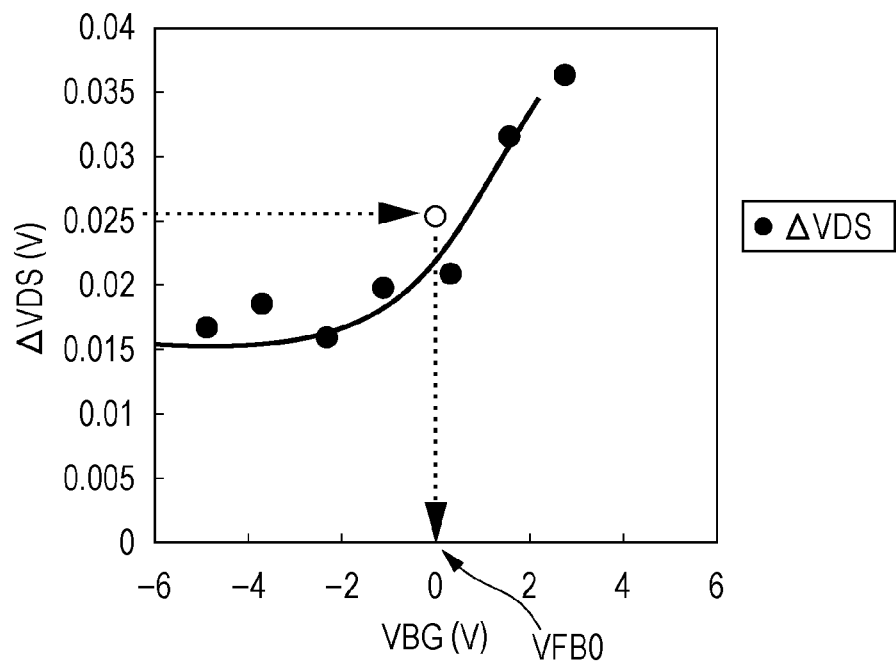
FIGS. 5A and 5B each illustrate the relationship between a back gate voltage and a variation in drain-source voltage.

FIG. 5A illustrates the relationship between a back gate voltage VBG measured in the second transistor in FIG. 4 and a variation ΔVDS in the drain-source voltage corresponding to the change of threshold voltage caused by electrical stress. In FIG. 5A, an open circle indicates the relationship between the gate voltage in the first transistor having no back gate electrode in FIG. 4 and the variation ΔVDS in the drain-source voltage thereof. It is assumed that the source voltage is a reference voltage, VG denotes the gate voltage, and VD denotes the drain voltage. FIG. 5A illustrates data based on the condition that when VG=VD=0 V, a drain-source current IDS of 4 µA flows as a constant current to cause electrical stress, namely, apply constant current stress for 3162 seconds. Referring to FIG. 5A, it is found that a variation in threshold voltage of the second transistor can be reduced by applying a voltage lower than the flat band voltage VFB0 defined by the above-described Equation (2) to the back gate electrode of the second transistor, as compared to a variation in threshold voltage of the first transistor. The reason can be that when a voltage lower than the flat band voltage VFB0 is applied to the back gate electrode of the second transistor, the carrier density of the region on the back gate electrode (second insulating layer) side of the semiconductor layer is lower than that in the second insulating layer side of the semiconductor layer in the first transistor.

In other words, it is found from the measurements illustrated in FIG. 5A that when the second transistor is driven while the back gate voltage VBG, expressed by the following equation, is applied to this TFT, a variation in threshold voltage caused by electrical stress in the second transistor can be lower than that in the first transistor.

$$VBG \leq VFB0 \qquad (3)$$

However, constant current stress applied when a current is large has to be further studied. The reason is that when a current is large, the effect of the carrier density of the region on the gate electrode side of the semiconductor layer becomes innegligible.

It is assumed that electrical stress is caused on the condition that when VG=VD=0 V, a drain-source current IDS of 40 µA that is ten times as high as that in the above-described condition is supplied. In this case, let VG_1 denote a gate voltage necessary to obtain this current in the first transistor and let VG_2 denote that in the second transistor. Since the back gate voltage VBG that satisfies Equation (3) is applied to the second transistor, the gate voltage necessary to supply the same IDS as that in the first transistor is increased, so that VG_2>VG_1. Accordingly, when the carrier densities of the regions on the gate electrode sides of the semiconductor layers of the first and second transistors are compared, the carrier density in the second transistor is higher than that in the first transistor. The change of threshold voltage caused by electrical stress in the second transistor is increased.

Specifically, regarding electrical stress caused by application of a constant current, the application of the back gate voltage VBG for controlling the back channel causes a conflict between the effect of reducing the change of threshold voltage in the region on the back gate electrode side of the semiconductor layer and the effect of increasing the change of threshold voltage on the gate electrode side of the semiconductor layer. The one effect overcomes the other effect at a certain voltage. In other words, a variation in threshold voltage has a minimum value at a certain back gate voltage VBG.

Figure 5B:
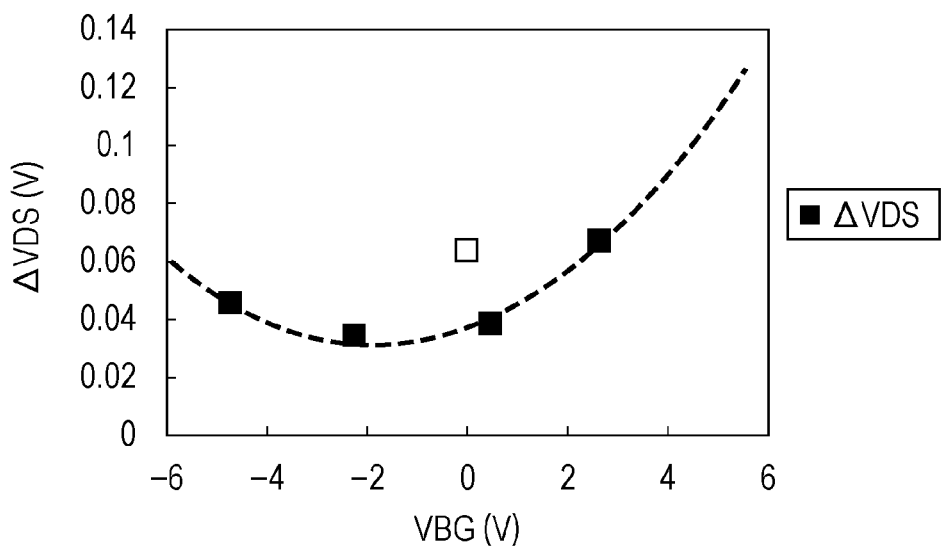

FIG. 5B illustrates measurements obtained when electrical stress was applied by allowing a constant current of 40 µA to flow between the drain and the source. FIG. 5B illustrates the variation ΔVDS in the drain-source voltage, corresponding to the change of threshold voltage, plotted against the back gate voltage VBG. In FIG. 5B, an open rectangle indicates the relationship between the gate voltage in the first transistor having no back gate electrode in FIG. 4 and the variation ΔVDS in the drain-source voltage thereof. It is found from FIG. 5B that when the back gate voltage VBG is reduced, the variation ΔVDS is also reduced to a certain value, and when the back gate voltage VBG is further reduced, the variation ΔVDS is adversely increased. In other words, in order to reduce the change of threshold voltage upon application of constant current stress with a large current, a voltage that satisfies Equation (3) and is within a proper range can be selected as the back gate voltage VBG. The voltage within the proper range depends on a current of constant current stress.

As described above, the placement of the back gate electrode on the high trap level density side of the semiconductor layer and the application of a voltage for reducing the carrier density to the back gate electrode are effective in reducing the change of threshold voltage caused by electrical stress.

Application of Constant Voltage Stress

For "constant voltage stress" caused by applying a constant voltage to the source, drain, and gate electrodes, as the drain voltage is higher, reverse bias is applied between the back gate and the drain in the region on the back gate electrode side of the semiconductor layer. Thus, the carrier density can be reduced. Accordingly, a back gate voltage VBG over a range wider than that expressed by Equation (3) is effective in reducing the change of threshold voltage.

Figure 6:
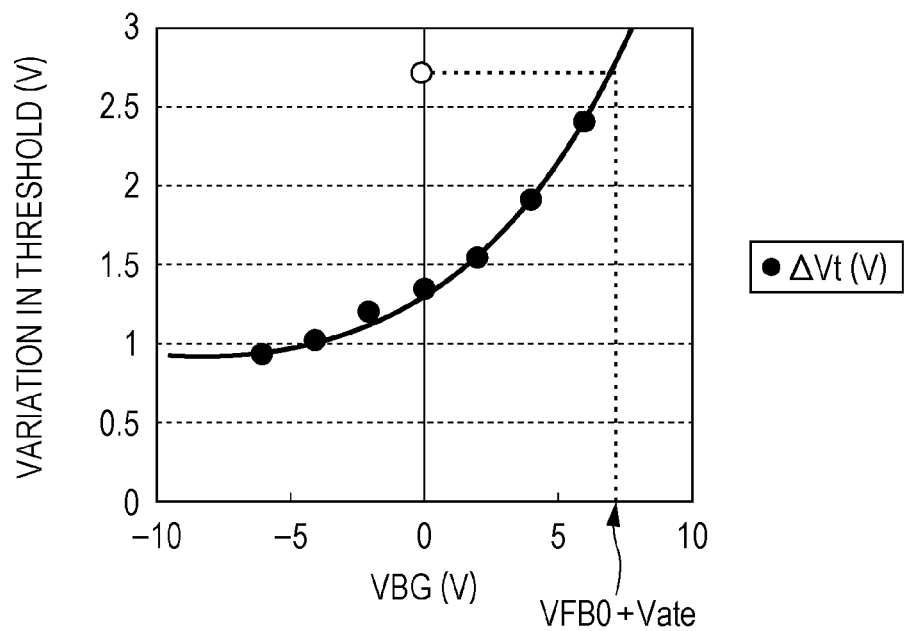
FIG. 6 illustrates the relationship between the back gate voltage and a threshold voltage.

FIG. 6 illustrates the relationship between the back gate voltage VBG and a variation in threshold voltage when VD=VG=20 V was continuously applied for 3162 seconds. Referring to FIG. 6, a value of the back gate voltage VBG effective in reducing the change of threshold voltage is in a wider range than that expressed by Equation (3) and is expressed by the following equation.

$$VBG < VFB0 + V\alpha \quad (4)$$

In this case, the value $V\alpha$ in Equation (4) is determined as follows.

When L denotes the channel length of a four-terminal TFT and VT denotes a threshold voltage, a voltage distribution analyzed in a saturation region of the TFT is expressed as $V(x)=(VG-VT)[1-\{1-(x/L)\}^{1/(\gamma+2)}]$, where $\gamma$ is a parameter of "0" or higher and indicates a deviation from an ideal characteristic of the TFT. The ideal characteristic is $\gamma=0$. In this equation, x denotes a position in the channel in the current direction. At the source end, x=0. At the drain end, x=L. When integration is performed from x=0 to x=L and the obtained value is divided by L, an average voltage expressed as Vave=$\int (V(x)/L)dx = (VG-VT)/(3+\gamma)$ is derived. In the measurements in FIG. 6, VG=(VD=) 20 V and VT=0. Assuming that $\gamma$ is 0, Vave=6 V. When it is assumed that the flat band voltage VFB0 is shifted by 6 V due to the effect of the drain voltage, this assumption is consistent with the measurements of constant voltage stress shown in FIG. 6. In other words, the average Vave of the drain-source voltage distribution V(x) corresponds to the value $V\alpha$ in Equation (4). As for the constant voltage stress, the range of the back gate voltage VBG effective in reducing the change of threshold voltage is expressed as VBG<VFB0+Vave.

A concrete method of obtaining the flat band voltage VFB0 will now be described.

Method of Obtaining Flat Band Voltage in Three-Terminal TFT

A method of obtaining a voltage, corresponding to the flat band voltage VFB0 in a three-terminal TFT having no back gate electrode, in a four-terminal TFT will be described. It is assumed that the flat band voltage VFB0 applied to the gate electrode of the four-terminal TFT is identical to that applied to the back gate electrode. This assumption is valid for an ideal case where there is no effect of, for example, fixed charge. In this case, the relationship between the back gate voltage VBG and a gate voltage Vg for allowing a current identical to the drain current flowing between the drain and the source when a gate voltage Vg' is applied to the three-terminal TFT to flow the drain and the source of the four-terminal TFT is expressed by the following equation.

$$Vg = VFB0 + \phi s - Qsc/C1 - (C2/C1) \times (VBG - VFB0) = Vg' - (C2/C1) \times (VBG - VFB0), \quad (5)$$

with
Qsc: a carrier density per unit area of the semiconductor layer;
$\phi s$: a potential at the interface between the gate insulating layer and the semiconductor layer;
C1: a capacitance per unit area of the first insulating layer; and
C2: a capacitance per unit area of the second insulating layer.

The fact that the gate voltage Vg depends on the back gate voltage VBG such that $(C2/C1) \times VBG$ has been confirmed in actual measurements. In addition, since the transfer characteristic parallel-shifts relative to the back gate voltage VBG, the flat band voltage VFB0 can also similarly satisfy the above-described dependence. Since Qsc=0 and $\phi s$=0 at the flat band voltage VFB0, the following expression is obtained.

$$Vg = VFB0 - (C2/C1) \times (VBG - VFB0) \quad (6)$$

To obtain the flat band voltage VFB0 using Equation (6), a flat band voltage when the back gate voltage VBG is 0 V is defined as VT1. Note that it is necessary to consider a flat band voltage VT1 when the specific electrical conductivity of the semiconductor layer is high and that when the specific electrical conductivity of the semiconductor layer is low distinctively from each other. The reason is as follows: When the specific electrical conductivity of the semiconductor layer is low, a current corresponding to the flat band current IFB defined by Equation (1) is not obtained from measurements regarding the transfer characteristic of a TFT in some cases. For example, such a case corresponds to a case where OFF current is large and a minimum drain current is equal to or higher than the flat band current IFB or a case where the flat band current IFB is small relative to the measurement accuracy of a measuring apparatus. In such a case, the fact that a gate-source voltage (turn-on voltage) VON1, at which drain current sharply rises in the transfer characteristic, substantially corresponds to the flat band voltage VT1 is used.

Specifically, when the specific electrical conductivity of the semiconductor layer is low like a-Si (IFB<$10^{-12}$ A, VD=0.1 V), the flat band voltage VFB0 derived from Equation (6) is given by the turn-on voltage VON1 at which the drain current rises in the transfer characteristic when VBG=0V. When the specific electrical conductivity is high like AOS (IFB>$10^{-12}$ A, VD=0.1 V), the flat band voltage VFB0 can be given by the flat band voltage VT1 when VBG=0V.

Low Specific Electrical Conductivity of Semiconductor Layer
(IFB<$10^{-12}$ A, VD=0.1 V)

The turn-on voltage at which the drain current rises in the transfer characteristic when VBG=0 V is derived from Equation (6) as follows.

$$VON1 = VFB0 - (C2/C1) \times (0 - VFB0)$$

Thus, the following equation is obtained.

$$VFB0 = VON1 \times C1/(C1+C2) \quad (7)$$

High Specific Electrical Conductivity of Semiconductor Layer
(IFB>$10^{-12}$ A, VD=0.1 V)

The flat band voltage VT1 when VBG=0 V is derived from Equation (6) as follows.

$$VT1 = VFB0 - (C2/C1) \times (0 - VFB0)$$

Thus, the following equation is obtained.

$$VFB0 = VT1 \times C1/(C1+C2) \quad (8)$$

Driving Condition for Reducing Change of Threshold Voltage by Electrical Stress

According to the above-described consideration and measurements, advantages of the present invention effective in reducing a variation in threshold voltage of a TFT caused by electrical stress can be obtained so long as a back gate voltage VBG within any of the following ranges is applied to the back gate electrode of a four-terminal TFT.

When the specific electrical conductivity of the semiconductor layer is low (IFB<$10^{-12}$ A, VD=0.1 V), the back gate voltage VBG within the following range based on Equation (3), Equation (7), and the turn-on voltage VON1 at which the drain current rises in the transfer characteristic when VBG=0 V can be applied.

$$VBG \leq VON1 \times C1/(C1+C2) \quad (9)$$

When the specific electrical conductivity of the semiconductor layer is high (IFB>$10^{-12}$ A, VD=0.1 V), the back gate voltage VBG within the following range based on Equation (3), Equation (8), and the flat band voltage VT1 when VGB=0 V can be applied.

$$VBG \leq VT1 \times C1/(C1+C2) \quad (10)$$

A light-emitting display device including AOS TFTs each of which includes a driving circuit including a channel layer made of a-IGZO (amorphous oxide semiconductor including In, Ga, and Zn) and an organic EL element as a light-emitting element, namely, an organic EL display according to an embodiment of the present invention will now be described. In this specification, the term "amorphous" means a state in which any apparent crystalline diffraction peak is not observed in X-ray diffraction.

The organic EL display according to this embodiment of the present invention includes a plurality of pixels each including the organic EL element and the driving circuit that drives the organic EL element. The driving circuit includes at least a switching a-IGZO TFT that supplies a data signal and a driving a-IGZO TFT that controls current supplied to the organic EL element. At least the current-control driving transistor of these a-IGZO TFTs is a four-terminal TFT including a back gate electrode in addition to gate, drain, and source electrodes. A voltage that satisfies the above-described Equation (10) is applied to the back gate electrode. In addition, another transistor in each pixel, e.g., the switching transistor may have a four-terminal configuration. A voltage may be applied to its back-channel control electrode of the transistor. In some cases, the back-channel control electrode also has a light-shielding function for the transistor.

The organic EL display including the a-IGZO TFTs has been described as an example. The present invention is applicable to a light-emitting display device including AOS other than a-IGZO as semiconductor and a light-emitting display device including a light-emitting element other than the organic EL element, e.g., an inorganic EL element. The present invention is further applicable to a display device, e.g., a liquid crystal display, which controls light transmittance or reflectance.

In addition, the present invention is widely applicable to circuits each including a TFT. Specifically, the present invention can be applied to matrix driving devices other than display devices, e.g., a pressure sensor including a pressure-sensitive element, an optical sensor including a photosensitive element, and a memory array. The same advantages as those described above can be obtained.

EXAMPLES

Examples of the present invention will be described below.

Example 1

A method of making a TFT, which includes a channel layer made of a-IGZO, used in the foregoing embodiment will be described with reference to FIG. 2.

Figure 2:
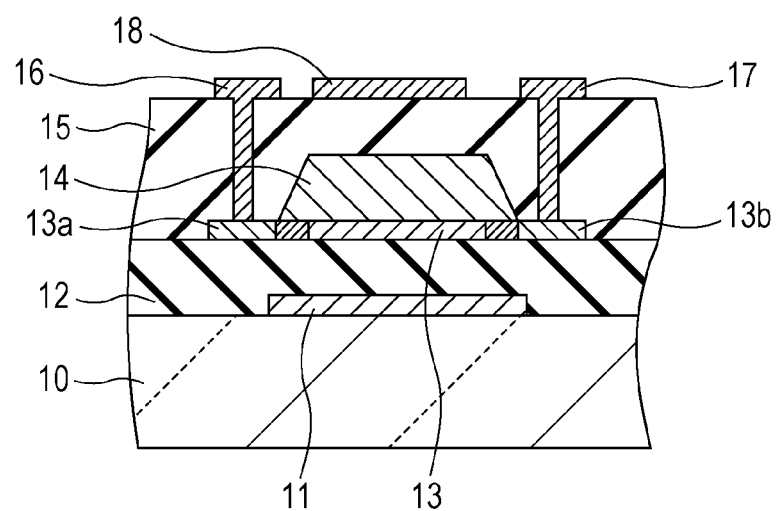
FIG. 2 is a cross-sectional view of the TFT in the present invention.

FIG. 2 illustrates a bottom-gate coplanar type oxide semiconductor TFT including a single channel protective layer 14.

First, an electrode layer for a gate electrode 11 (first conductive layer) was formed on a glass substrate 10 (1737 manufactured by Corning Inc.) by RF sputtering. Molybdenum (Mo) was used as a material for the electrode and the thickness of the electrode layer was set to 100 nm. After that, the electrode layer was patterned by photolithography, thus forming the gate electrode 11.

Next, a silicon oxide film having a thickness of 200 nm was formed as a gate insulating layer 12 (first insulating layer) by plasma CVD. The silicon oxide film was formed using a plasma CVD apparatus at a substrate temperature of 340° C. $SiH_4$ gas and $N_2O$ gas were used as source gases such that the gas flow ratio was set to 1:25 and input RF power was set to 0.9 W. In the silicon oxide film formation atmosphere, the total pressure was set to 173 Pa.

Subsequently, an amorphous IGZO film having a thickness of 30 nm was formed as an oxide semiconductor layer 13. The oxide semiconductor layer was formed using a DC sputtering apparatus at a substrate temperature of a room temperature (25° C.). A polycrystalline ceramic having a 4-inch diameter and a composition of $InGaZnO_4$ was used as a sputtering target and input DC power was set to 150 W. In the film formation atmosphere, the total pressure was set to 0.5 Pa and the ratio of gas flow of Ar to $O_2$ at that time was set to 80:20. After that, the film was patterned by photolithography, thus forming the oxide semiconductor layer 13.

A silicon oxide film having a thickness of 100 nm was formed as the channel protective layer 14 on the oxide semiconductor layer 13 by sputtering. The silicon oxide film was formed using an RF sputtering apparatus at a substrate temperature of room temperature. A $SiO_2$ target having a 4-inch diameter was used and input RF power was set to 500 W. In the silicon oxide film formation atmosphere, the total pressure was set to 0.5 Pa and the ratio of gas flow of Ar to $O_2$ was set to 90:10.

Further, a silicon nitride film having a thickness of 300 nm was formed as an insulating interlayer 15 by plasma CVD. A substrate temperature upon formation of the silicon nitride film by plasma CVD was set to 250° C. As for process gases, $SiH_4$, $NH_3$, and $N_2$ were used. The gas flow ratio of $SiH_4$, $NH_3$, and $N_2$ was set to 1:2.5:25. Input RF power was set to 0.9 W and pressure was set to 150 Pa. Simultaneously with the formation of the insulating interlayer 15, portions, covered with no channel protective layer 14, of the oxide semiconductor layer 13 served as a drain 13a and a source 13b. After that, contact holes were formed in the insulating interlayer 15 by photolithography and etching. In this example, the channel protective layer 14 and the insulating interlayer 15 correspond to the second insulating layer.

Subsequently, an electrode layer for formation of a drain interconnect 16, a source interconnect 17, and a light-shielding layer 18 (second conductive layer 2) was formed by RF sputtering. Mo was used as a material for the electrode layer and the thickness of the layer was set to 100 nm. After that, the electrode layer was patterned by photolithography, thus forming the drain interconnect 16 and the source interconnect 17.

Finally, annealing was performed in a furnace in the atmosphere at 200° C. for 0.5 hour to remove damage caused by, for example, dry etching.

In this manner, the a-IGZO TFT having the cross section illustrated in FIG. 2 can be made.

Simultaneously with the making of the TFT of FIG. 2, a related-art TFT including no light-shielding layer 18 was made.

Figure 7A:
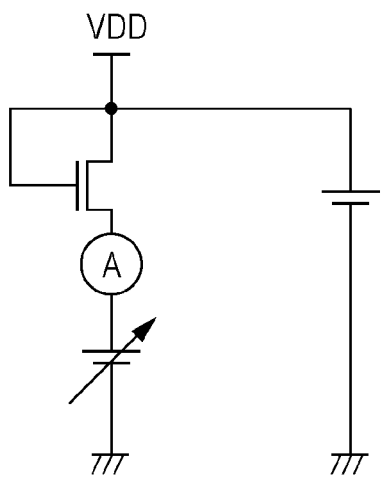
FIGS. 7A and 7B each illustrate an equivalent circuit for measurement in EXAMPLE 1 of the present invention.
Figure 7B:
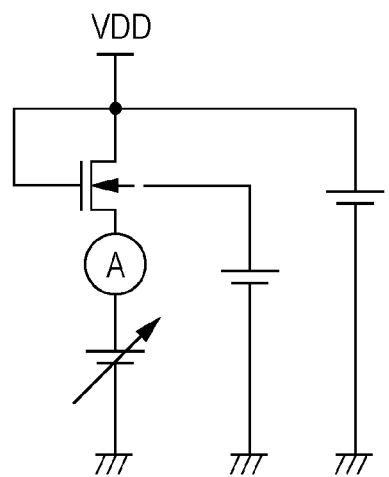
Figure 8A:
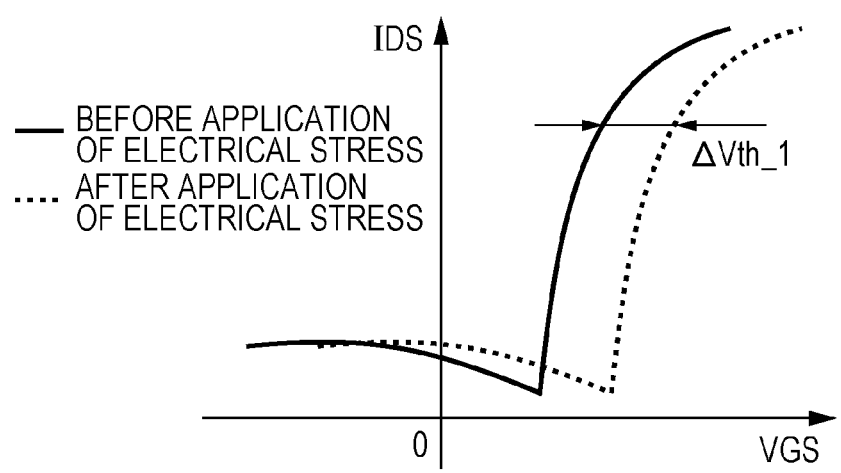
FIGS. 8A and 8B show the transfer characteristic of a related-art TFT and that of a TFT according to EXAMPLE 1, respectively.
Figure 8B:
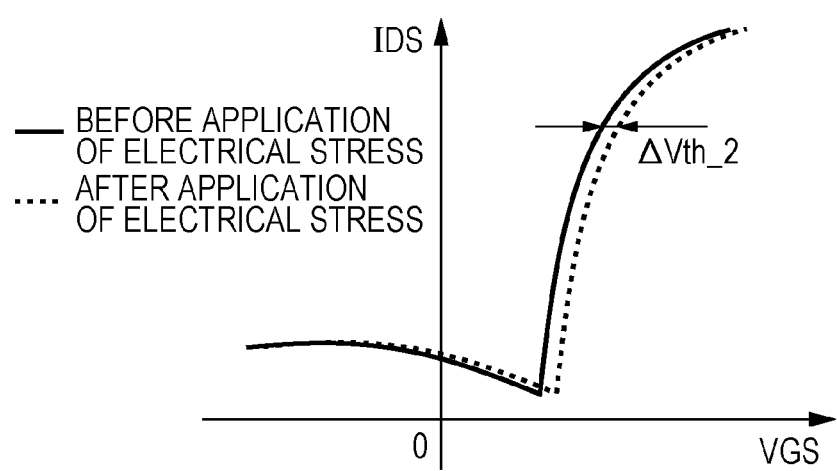

FIGS. 7A and 7B illustrate equivalent circuits of the above-described made a-IGZO TFTs under application of electrical stress. FIGS. 8A and 8B illustrate their transfer characteristics (IDS-VGS characteristics) of the TFTs before and after application of electrical stress.

FIGS. 7A and 8A are related to the related-art three-terminal TFT including no light-shielding layer 18. FIGS. 7B and 8B are related to the four-terminal TFT including the light-shielding layer 18.

As for application of electrical stress, the source voltage was set to a reference voltage and a voltage of 20 V was applied to a node at which the terminals of the drain and gate electrodes were short-circuited. In the TFT including the light-shielding layer, a voltage applied to the light-shielding layer 18, corresponding to the back gate electrode, was fixed to 1 V. When the above values are applied to the above-described Equation (8), since C1=C2, VFB0=½·VT1 in the above-described process. In this example, a voltage of 1 V that satisfies VBG≤½·VT1 was used as the back gate voltage VBG applied to the light-shielding layer 18.

When FIGS. 8A and 8B are compared, ΔVth_1>ΔVth_2. As for a variation in gate-source voltage in the transfer characteristic before and after application of electrical stress, it is found that a variation in the TFT in which 1 V was applied to the light-shielding layer 18 is less than that in the related-art TFT including no light-shielding layer 18.

Making a display device including the organic EL element as a light-emitting element will now be described with reference to FIG. 1.

First, a silicon nitride film was formed as an insulating layer 128 on the oxide semiconductor TFT of FIG. 2 by plasma CVD. After that, a contact hole was formed in the insulating layer 128 by photolithography. Then, an electrode 130 was formed and connected to the source interconnect 17 through the contact hole in the insulating layer 128. As for the electrode 130, indium tin oxide (ITO) made by sputtering was used. Next, a hole-transport layer 131*a* and a light-emitting layer 131*b* were formed on the electrode 130 by evaporation. As for materials for these layers, α-NPD was used for the hole-transport layer 131*a* and Alq$_3$ was used for the light-emitting layer 131*b*. In addition, an electrode 132 was formed on the light-emitting layer 131*b* by evaporation. As a material for the electrode 132, MgAg was used. In this manner, the display device (FIG. 1) including the organic EL element as a light-emitting element was made.

Figure 9:
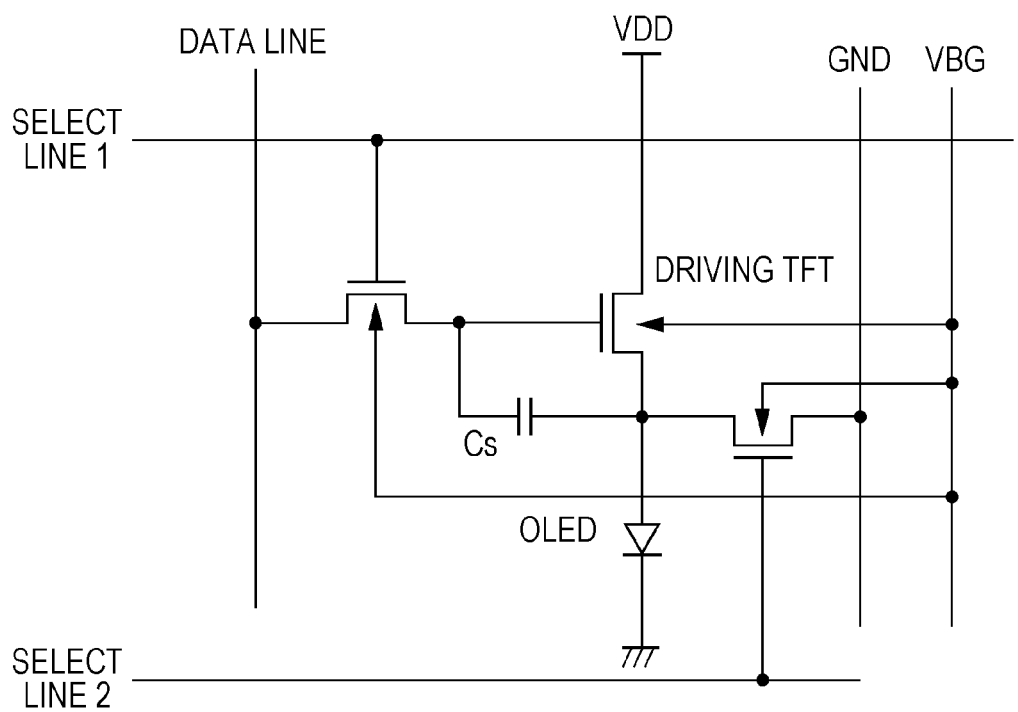
FIG. 9 illustrates an equivalent circuit per pixel of an organic EL display according to EXAMPLE 1.

FIG. 9 illustrates an equivalent circuit per pixel of the made organic EL display.

The light-shielding layer 18, serving as the back gate electrode of each of three TFTs, is connected to the back gate voltage VBG. As for the back gate voltage VBG, a voltage that satisfies the above-described Equation (9) or (10) is applied.

In the organic EL display according to this example including such a pixel circuit with the above-described connection, the a-IGZO TFT can be operated so that a variation in threshold voltage of the TFT caused by electrical stress is at or below a predetermined value. Consequently, a reduction of image quality caused by electrical stress can be prevented.

Example 2

A TFT in EXAMPLE 2 is the same as that in EXAMPLE 1, except that the ratio of gas flow of Ar to O$_2$ upon formation of the oxide semiconductor layer 13 was set to 98:2 in the method of making the a-IGZO TFT. In addition, a TFT including no light-shielding layer 18 was simultaneously made.

Figure 10A:
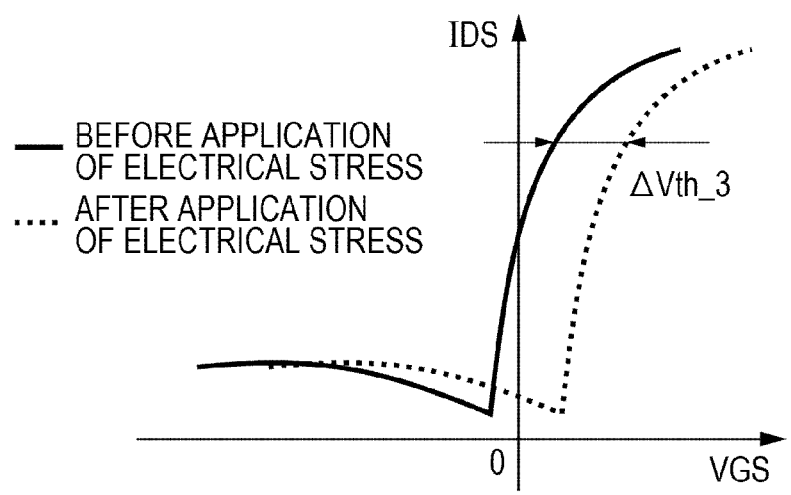
FIGS. 10A and 10B show the transfer characteristic of a related-art TFT and that of a TFT according to EXAMPLE 1 of the present invention, respectively.
Figure 10B:
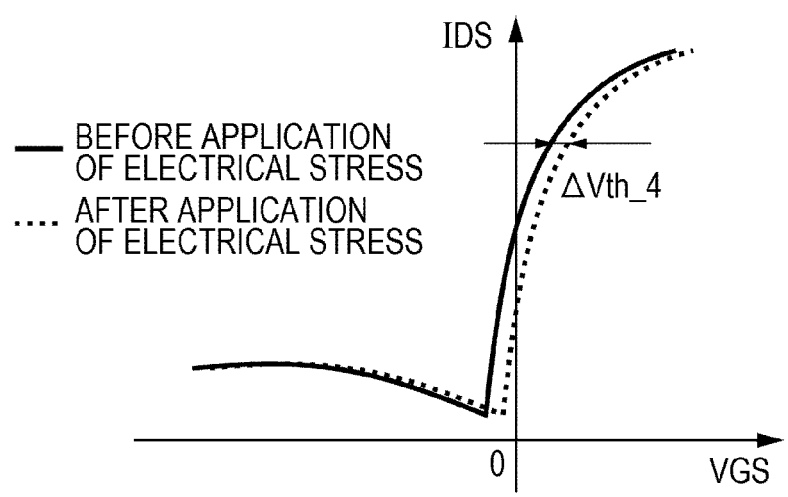

FIGS. 10A and 10B illustrate their transfer characteristics (IDS-VGS characteristics) of the above-described a-IGZO TFTs before and after application of electrical stress.

FIG. 10A is related to the related-art three-terminal TFT including no light-shielding layer 18. FIG. 10B is related to the four-terminal TFT including the light-shielding layer 18.

As for application of electrical stress, the source voltage was set to a reference voltage and a voltage of 20 V was applied to a node at which the terminals of the drain and gate electrodes were short-circuited. In the TFT including the light-shielding layer, a voltage applied to the light-shielding layer 18, corresponding to the back gate electrode, was fixed to 0 V.

When FIGS. 10A and 10B are compared, ΔVth_3>ΔVth_4. As for a variation in gate-source voltage in the transfer characteristic before and after application of electrical stress, it is found that a variation in the TFT in which 0 V was applied to the light-shielding layer 18 is less than that in the related-art TFT including no light-shielding layer.

Further, an organic EL display was made similar to EXAMPLE 1.

Figure 11:
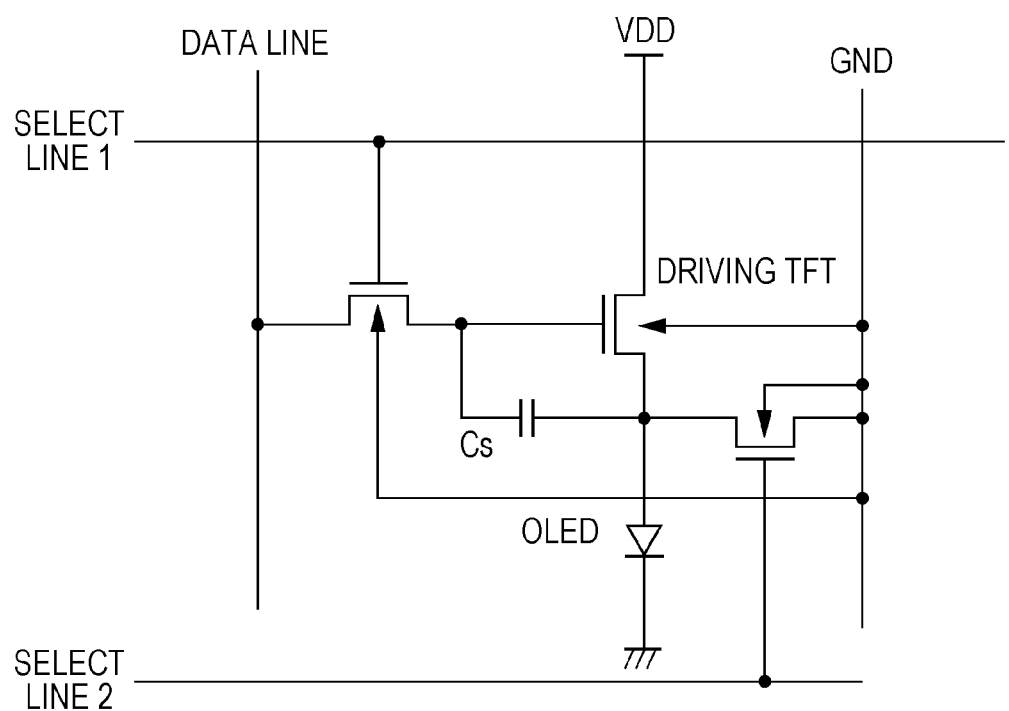
FIG. 11 illustrates an equivalent circuit per pixel of an organic EL display according to EXAMPLE 2.

FIG. 11 illustrates an equivalent circuit per pixel of the made organic EL display.

The light-shielding layer 18, serving as the back gate electrode, in each of three TFTs is connected to 0 V (GND). Accordingly, the number of interconnects is less than that in EXAMPLE 1, thus increasing the aperture ratio.

In the organic EL display according to this example including such a pixel circuit with the above-described connection, the a-IGZO TFT can be operated so that a variation in threshold voltage of the TFT caused by electrical stress is at or below a predetermined value. Consequently, a reduction of image quality caused by electrical stress can also be prevented in EXAMPLE 2.

The present invention is applied to a light-emitting display device including an AOS TFT in which a driving circuit for a light-emitting element includes a channel layer made of AOS. In addition, the present invention is also applicable to matrix driving devices other than the light-emitting display device, for example, a pressure sensor array including a pressure-sensitive element, an optical sensor array including a photosensitive element, and a memory array.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-006862 filed Jan. 15, 2010, which is hereby incorporated by reference herein in its entirety.

What is claimed is:

1. A method of driving a bottom-gate type transistor including a substrate, a first conductive layer, a first insulating layer, a semiconductor layer, a second insulating layer, and a second conductive layer in an order from a top surface of the substrate going upward from bottom to top,
wherein the semiconductor layer connected to a source electrode and a drain electrode of the transistor and comprises an amorphous material in which any crystalline diffraction peak is not observed in X-ray diffraction, the source electrode and the drain electrode are disposed on the second insulating layer, and the first conductive layer serves as a gate electrode of the transistor, and
wherein a flat band current IFB of the bottom-gate type transistor represented by the following equation (1) is smaller than $10^{-12}$ A when VD is 0.1V:

$$IFB = ts \times W \times \sigma \times VD/L \qquad (1)$$

where σ denotes electrical conductivity of the semiconductor layer, W denotes the channel width of the bottom-gate type transistor, L denotes the channel length thereof, ts denotes the thickness of the semiconductor layer, and VD denotes a drain voltage,
the method comprising:
applying a voltage to the gate electrode to induce carriers to the semiconductor layer;
supplying a constant current between the source electrode and the drain electrode; and applying a voltage to the second conductive layer with respect to a voltage of the source electrode, wherein the voltage applied to the second conductive layer is lower than $VON1 \times C1/(C1+C2)$ where C1 denotes a capacitance per unit area of the first insulating layer, C2 denotes a capacitance per unit area of the second insulating layer, and VON1 denotes a potential of the gate electrode with respect to the source electrode at which the drain current rises in the transfer characteristic of the transistor when the second conductive layer is set to 0 V.

2. The method according to claim 1, wherein the transistor includes a channel layer comprising amorphous oxide semiconductor.

3. A device comprising:
a transistor driven by the method according to claim 2.

4. A device comprising:
a transistor driven by the method according to claim 1.

5. The method according to claim 1, wherein the first insulating layer is made of silicon nitride.

6. The method according to claim 1, wherein the second insulating layer includes a silicon oxide layer and a silicon nitride layer in this order from the semiconductor layer side.

7. The method according to claim 1, wherein the drain electrode and the first conductive layer are short-circuited and the voltage is applied to the second conductive layer.

* * * * *